United States Patent [19]

Mattes

[11] Patent Number: 5,224,107
[45] Date of Patent: Jun. 29, 1993

[54] METHOD IN A PARALLEL TEST APPARATUS FOR SEMICONDUCTOR MEMORIES

[75] Inventor: Heinz Mattes, Munich, Fed. Rep. of Germany

[73] Assignee: Siemens Aktiengesellschaft, Munich, Fed. Rep. of Germany

[21] Appl. No.: 528,552

[22] Filed: May 25, 1990

[30] Foreign Application Priority Data

May 31, 1989 [EP] European Pat. Off. ........... 89109839

[51] Int. Cl.⁵ ............................................. G06F 11/10
[52] U.S. Cl. .................... 371/51.1; 371/21.1; 371/70
[58] Field of Search .................. 371/51.1, 21.1, 21.2, 371/21.3, 37.6, 37.1, 49.1, 70

[56] References Cited

U.S. PATENT DOCUMENTS

| | | | |
|---|---|---|---|
| 3,353,155 | 11/1967 | Chien et al. | 371/37.6 |
| 3,782,487 | 11/1988 | Smelser | 371/21.6 |
| 3,891,969 | 6/1975 | Christensen | 371/49.2 |
| 4,483,003 | 11/1984 | Beal | 371/51.1 |
| 4,546,475 | 10/1985 | Sharpless et al. | 371/49 |
| 4,672,582 | 6/1987 | Nishimura et al. | 365/201 |
| 4,672,614 | 6/1987 | Yoshida | 371/38.1 |
| 4,742,489 | 5/1988 | Hoffmann | 365/201 |
| 4,742,490 | 5/1988 | Hoffmann | 365/201 |
| 4,752,929 | 6/1988 | Kantz et al. | 371/21.2 |
| 4,841,525 | 6/1989 | Lieske et al. | 371/21 |
| 4,939,733 | 7/1990 | Furutani | 371/40.1 |

OTHER PUBLICATIONS

"Memory Error Detection Using Error Correction Code Hardware", *IBM Technical Disclosure Bulletin*, vol. 28, No. 8, Jan. 1986, pp. 3698–3699.

"Two-Pass Stuck-Fault Memory Test Error Correction Code", *IBM Technical Disclosure Bulletin*, vol. 28, No. 12, May 1986, pp. 5170–5171.

"Two-Pass Array Test Method", *IBM Technical Disclosure Bulletin*, Jun. 1981, vol. 24, No. 1B, Jun. 1981, pp. 613–614.

"Proposal for Optional Special Modes for Adddress Multiplexed DRAM", *JEDEC Solid State Products Engineering Council*, Comittee Letter Ballot, JC-42.3-8-6-95A, Mar. 18, 1987, pp. 1–5.

*Primary Examiner*—Robert W. Beausoliel, Jr.
*Assistant Examiner*—Ly V. Hua
*Attorney, Agent, or Firm*—Hill, Steadman & Simpson

[57] ABSTRACT

A method in a parallel test apparatus provides for parallel testing a plurality of memory cells of a semiconductor module in parallel. The information read from the memory cells that are forwarded via the parallel test apparatus are tested to determine whether or not all cells are free of error. When exactly one error is present, the parallel test indicates the address of the faulty memory cell. Code words in the sense of the Hamming code are employed as test patterns. The length of the code words corresponds to the plurality of memory cells to be tested in parallel. The parallel test apparatus is constructed on the memory chip in the form of weighted parity check circuits.

12 Claims, 3 Drawing Sheets

METHOD IN A PARALLEL TEST APPARATUS FOR SEMICONDUCTOR MEMORIES

BACKGROUND OF THE INVENTION

1. Field of the Invention

The present invention relates to a method operable in a parallel test apparatus of memory cells of a memory, in which the memory is divided into groups of memory cells and one group of memory cells is activated by addressing words and/or bit lines of a memory, in which a test pattern is respectively written into all memory cells of the group and respectively all memory cells of the group are subsequently read and the read-out information are supplied to a parallel test mechanism. A first result is calculated, a further test pattern is formed from the test pattern and the further test pattern is written into all memory cells of the same group and is, in turn, subsequently read from all memory cells of the same group and the read-out, further information are supplied to the parallel test mechanism. A second result is calculated.

2. Description of the Prior Art

In the manufacture of semiconductor memories, the time that it takes to test the entire semiconductor memory is to be tested for its operability represents a significant cost factor. The test time also increases to a considerable degree, particularly with increasing size of the memory modules.

Up to now, sequential test methods have been almost exclusively used for checking the operability of memory modules, with the disadvantage of a particularly long testing time. There are therefore efforts to parallelize the sequentially-executed test insofar as possible. A method and an apparatus to parallel test a memory with which it is possible to test four bits of a semiconductor memory in parallel is known from the publication JEDEC Solid State Products Engineering Council, March 1987. Two test patterns that are read parallel into the memory cells are available for such a four-bit parallel method. A first test pattern for this purpose is formed of a sequence of ones and a second test pattern is formed from a sequence of zeros. There is no flexibility in the selection of possible test patterns in this method. Upon reading the result from the memory cells, moreover, only one decision is possible, namely whether there are defective memory cells or whether all memory cells are functional.

SUMMARY OF THE INVENTION

It is an object of the present invention, therefore, to provide a method for the parallel testing of semiconductor memories, whereby the test patterns are individually selectable and with which an accurate indication concerning the available faults in the memory cells is possible.

A further object of the invention is to provide an apparatus for carrying out the method of the invention, whereby the circuit outlay for implementing of the semiconductor memories is low and operations on the existing memory architecture are not necessary.

The above object for the method is achieved in a method of the type generally set forth above which is particularly characterized in that a test pattern and a further test pattern are each formed of a code word having freely-selectable data bits, in that the further test pattern is formed of the one's complement of the test pattern and the first and second results represent first and second result vectors, in that the first and second result vectors are utilized for the determination of the number errors and for the determination of the memory cells within the group of memory cells affected with the error.

The object of the invention, with respect to the apparatus, is achieved in a testing structure of the type generally set forth above which is particularly characterized in that the parallel test apparatus is composed of a plurality of parity check circuits prescribed by the number of rows of a test matrix and each row of the test matrix is allocated to a parity check circuit. The formation of a modulo 2 matrix multiplication between the information read from the memory cells of the group and the test matrix is realized such that a input of the parity check circuit belonging to a row of the test matrix is allocated to a respective output of the memory cells of a group which are connected to one another precisely when the appertaining column of the row of the test matrix has a "1" and which are not connected to one another precisely when the appertaining column of the row of the test matrix has a "0". An element of the test vector can be taken at the output of each parity check circuit.

According to a particular feature of the method of the invention, the method is particularly characterized in that the first or, respectively, second result vector is formed of a modulo 2 matrix multiplication between the information read from the memory cells of the group or, respectively, the read-out, further information and a test matrix prescribed by an error-correcting code.

According to another feature of the method of the invention, the method is particularly characterized in that the first and second result vectors are calculated for the remaining groups of memory cells and are utilized for the calculation of the number of errors and for the identification of the memory cells within the remaining groups of memory cells affected with the errors.

According to another feature of the method of the invention, the method is particularly characterized in that a code word is composed of a data vector having freely-selectable data bits and of a redundancy vector having prescribed redundancy bits, in that the redundancy vector is calculated from a modulo 2 matrix multiplication between a redundancy matrix prescribed by an error-correcting code and the code word. The first and second result vectors are formed of an error bit for an even-numbered and an odd-numbered plurality of errors and bits for individual error address. The first and second result vectors in a group of memory cells are utilized for the calculation of the number of errors and for the identification of the memory cell within the group of memory cells affected with an error, being utilized such that all memory cells within the group are functional the first and second result vectors are when zero. A memory cell in the group is considered non-functional when one of the two result vectors is zero and the other of the two result vectors indicates an error. The address of the non-functional memory cell within the groups is indicated by the bits of the individual error address in the other of the two result vectors. Exactly two memory cells are non-functional within the group when one result vector is equal to zero and the further result vector indicates two errors. The two or more memory cells within the group are non-functional when the first and second result vectors indicate an error. More than two memory cells within the group are considered non-functional for all other bit combinations of the test result vectors.

According to another feature of the invention, the method is particularly characterized in that the code word is formed with the assistance of the Hamming code, in that one of the two result vectors indicates an odd-numbered plurality of errors when a first bit thereof is not equal to zero, and in that one of the two result vectors indicates an even-numbered plurality of errors when a first bit thereof is equal to zero and the remaining bits thereof are not equal to zero.

According to another feature of the invention, the method is particularly characterized in that a group of memory cells is composed of 4×4 bit words and the information read from the memory cells are supplied to the parallel test mechanism as 4×4 bit words, the parallel test mechanism having a width of 16 bits, and in that the code word contains an 11-bit wide data vector and a 5-bit wide redundancy vector.

According to another feature of the invention, the apparatus is particularly characterized in that at least one of the parity check circuits is constructed of cascaded parity check modules.

According to another feature of the invention, the apparatus is particularly characterized in that the parallel test mechanism has a width of 16 bits for the information read from the memory cells of the group and the respective first, second and third element of the result vector can be taken at the respective first, second and third parity check circuits. Each parity check circuit is constructed of five parity check modules, whereby the respective first four parity check modules have outputs connected to inputs of the fifth parity check module and the output of the fifth parity check module forms an output of the parity check circuit. According to this feature of the invention, the first parity check module of the first parity check circuit comprises inputs for the bits 1–4 of the 16-bit, read-out information of the memory cell of the group. The second parity check module of the first parity check circuit comprises inputs for the bits 5–8 of the 16-bit, read-out information of the memory cells of the group, the third parity check module of the first parity check circuit comprises inputs for the bits 9–12 of the 16-bit, read-out information of the memory cells of the group. The fourth parity check module of the first parity check circuit comprises inputs for the bits 13–16 of the 16-bit, read-out information of the memory cells of the group. Also according to this feature of the invention, the respective first and third inputs of the first, second, third and fourth parity check modules of the second parity check circuit are each applied to a fixed voltage value and the second input of the first parity check module of the second parity check circuit is connected with the bit 2 and the fourth input thereof is connected with the bit 4 of the read-out information. The second input of the second parity check module of the second parity test circuit is connected to the bit 6 and the fourth input thereof is connected to the bit 8 of the read-out information. The second input of the third parity check module of the second parity check circuit is connected to the bit 10 and the fourth input thereof is connected to the bit 12 of the read-out information. The second input of the fourth parity check module of the second parity check circuit is connected to the bit 14 and the fourth input thereof is connected to the bit 16 of the connected information. This feature is also characterized in that the respective first and second inputs of the first, second, third and fourth parity check modules of the third parity check circuit are each applied to a fixed voltage and the third input of the first parity check module of the third parity check circuit is connected to the bit 3 and the fourth input thereof is connected to the bit 4 of the read-out information. The third input of the second parity check module of the third parity check circuit is connected to the bit 7 and the fourth input thereof is connected to the bit 8 of the read-out information. The third input of the third parity check module of the third parity check circuit is connected with the bit 11 and the fourth input thereof is connected to the bit 12 of the information to be read out. Also, the third input of the fourth parity check module is connected to the bit 15 and the fourth input thereof is connected to the bit 16 of the information to be read. This feature is further characterized in that the element of the fourth and fifth result vectors can be respectively taken at an output of an EXCLUSIVE-OR gate circuit, whereby a first input of one of the EXCLUSIVE-OR gates for the fourth element of the result vector is interconnected to the output of the second parity check module of the first parity check circuit and a second input of the same EXCLUSIVE-OR gate is connected to an output of the fourth parity module of the first parity check circuit. A first input of another EXCLUSIVE-OR gate for the fifth element of the result vector is connected to an output of the third parity check module of the first parity check circuit and a second input of the same EXCLUSIVE-OR gate is connected to an output of the fourth parity check module of the first parity check circuit.

According to another feature of the apparatus of the invention, the apparatus is particularly characterized in that the parallel test mechanism has a width of 16 bits for the information read from the memory cells of the group and the respective first, second and third elements of the result vector can be taken at a respective first, second and third parity check module. The first, second and third parity check modules are preceded by identically-constructed logic circuits. Each logic circuit has a first, second, third and fourth inputs and has first, second and third outputs. The bits 1–4 of the 16-bit read-out information of the memory cell of the group are connected to the first, second, third and fourth inputs of the first logic circuit. The bits 5–8 of the 16-bit read-out information of the memory cell of the group are connected to the respective first, second, third and fourth inputs of the second logic circuit. The bits 9–12 of the 16-bit read-out information of the memory cell of a group are connected to the respective first, second, third and fourth inputs of the third logic circuit and the bits 13–16 of the 16-bit read information of the memory cell of a group are connected to respectively the first, second, third and fourth inputs of the fourth logic circuit. This feature also is characterized in that the first output of the respective first, second, third and fourth logic circuit is connected to the first parity check module, the second output of the respective first, second, third and fourth logic circuit is connected to the second parity check module and the third output of the respective first, second, third and fourth logic module is connected to the third parity check module. It is also included in this feature of the invention that the element of the fourth and fifth result vectors can be respectively taken at an output of an EXCLUSIVE-OR circuit, whereby a first input of one EXCLUSIVE-OR gate for the fourth element of the result vector is connected to the first output of the second logic circuit and the second input of the same EXCLUSIVE-OR gate is connected to the first output of the fourth logic circuit, in that a first input of another EXCLUSIVE-OR gate for the fifth element of the result vector is connected to the first output of the third logic circuit and a second input of the same EXCLUSIVE-OR gate is connected to the first output of the fourth logic circuit.

According to another feature of the invention, a logic circuit contains four EXCLUSIVE-OR gates, whereby a first EXCLUSIVE-OR gate of a logic circuit has a first input and a second input respectively representing the first and second inputs of a logic circuit and a second EXCLUSIVE-OR gate of the logic circuit has a first input and a second input respectively representing the third and fourth inputs of a logic circuit. A third EXCLUSIVE-OR gate is respectively connected to the second inputs of the first and second EXCLUSIVE-OR gates of a logic circuit. A respective output of the first and second EXCLUSIVE-OR gates of a logic circuit is connected to a respective input of a fourth EXCLUSIVE-OR gate of a logic circuit and an output of this fourth EXCLUSIVE-OR gate forms the first output of a logic circuit. An output of the third EXCLUSIVE-OR gate of a logic circuit represents the second output of a logic circuit and an output of the second EXCLUSIVE-OR gate of a logic circuit represents the third output of a logic circuit.

According to another feature of the invention, the apparatus is particularly characterized in that the other EXCLUSIVE-OR gate for the fifth element of the result vector is part of the fifth parity check module of the first parity check circuit.

According to another feature of the invention, the apparatus is particularly characterized in that the parity check modules are each respectively constructed of first, second and third EXCLUSIVE-OR gates whereby the EXCLUSIVE-OR gates have two inputs and an output and the output of the first EXCLUSIVE-OR gate is connected to a first input of the third EXCLUSIVE-OR gate and the output of the second EXCLUSIVE-OR gate is connected to a second input of the third EXCLUSIVE-OR gate, in that a first input and a second input of the first EXCLUSIVE-OR gate and a first input and a second input of the second EXCLUSIVE-OR gate form the inputs of the parity check module and an output of the third EXCLUSIVE-OR gate forms the output of this parity check module.

According to another feature of the invention, the apparatus is particularly characterized in that each of the parity check modules are constructed of four chained push-pull stages and two chained push-pull stages thereby form an EXCLUSIVE-OR function, whereby each push-pull stage contains a first voltage input and a second voltage input, a first voltage output and a second voltage output and a first data input and a second data input. The first voltage input of the first push-pull stage is connected to a first voltage and the second voltage input of the first push-pull stage is connected to a second voltage. The first and second voltage outputs of the fourth push-pull stage forms a first and second complementary outputs of the parity check module. The push-pull stages are chained such that a respective first and second voltage output of the one push-pull stage is interconnected to a respective first and second voltage input of the other push-pull stage, and that the respective first and second, mutually-complementary data input of the fourth push-pull stages represent inputs of the parity check module.

According to another feature of the invention, the apparatus is particularly characterized in that a push-pull stage is constructed of four field-effect transistors of the same conductivity type, whereby a first field-effect transistor and a second field-effect transistor form a first series circuit and a third field-effect transistor and a fourth field-effect transistor form a second series circuit. The first and second series circuits are connected in parallel, whereby a terminal of the first field-effect transistor and a terminal of the fourth field-effect transistor form a first, common terminal and a terminal of the second field-effect transistor and a terminal of the third field-effect transistor form a second common terminal. The first common terminal forms a first voltage input and the second common terminal forms a second voltage input. A center terminal of the first series circuit represents a first voltage output and a center terminal of the second series circuit represents a second voltage output of a push-pull stage. A gate terminal of the first field-effect transistor and a gate terminal of the third field-effect transistor in common form a first data input and a gate terminal of the second field-effect transistor and a gate terminal of the fourth field-effect transistor in common form a second data input.

According to another feature of the invention, the apparatus is particularly characterized in that the field-effect transistors of the push-pull stages are n-channel field effect transistors and the fixed voltage value is formed by a reference potential, in particular ground.

According to another feature of the invention, the apparatus is particularly characterized in that the field-effect transistors of the push-pull stages are p-channel field effect transistors and the fixed voltage value is formed by the operating voltage.

The advantages achieved in practicing the present invention are particularly that the memory cells in the immediate environment of one another can be reliably tested due to the high flexibility of the selection of the test patterns. It is possible to reliably distinguish single-bit and multi-bit errors by employing the method of the invention and it is possible to output the address of the error bit given the single-bit errors. Further, the free-selection of the test patterns and a corresponding configuration of the apparatus makes it possible to test a greater plurality of memory cells in parallel, this leading to a further reduction in the test time for the appertaining semiconductor memory. The required circuit outlay for the parallel test apparatus is low and can be flexibly adapted to the configuration of the respective memory.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

In the method of the present invention for the parallel testing of memory cells of a memory, the memory is divided into groups of memory cells. One group of memory cells is thereby activated by the addressing of word and bit lines and, as symbolically indicated in FIG. 1, a code word C is written into all memory cells of this group of the memory SP. When only the word lines of a semiconductor memory were used for the selection of the groups of the memory cells, then the code word C is consequently written into all memory cells connected to these word lines. In the next step of the method, these memory cells of the appertaining group are read out and the information F+C that are read out are supplied to a parallel test mechanism PV. A first result vector EV is thereby determined at the output of the parallel test mechanism PV. The reference to the information read as F+C is intended to indicate that the code word C was falsified by an error portion F due to malfunctioning memory cells. In order to test the memory cell for its capability of storing a low signal and a high signal, a second result vector is also required in addition to the first result vector. To this end, the one's complement is formed from the code word C, so that a further code word C' arises that is likewise written into the appertaining memory cells of the group. All memory cells of this group are subsequently read out again and the information read C'+F' are again supplied to the parallel test mechanism PV, as a result of which the second result vector EV' is identified. An identification of the number of errors can subsequently be carried out on the basis of two result vectors and, in case exactly one error is present, an identification of the memory cell affected with the error can be carried out within the appertaining group.

Figure 1:
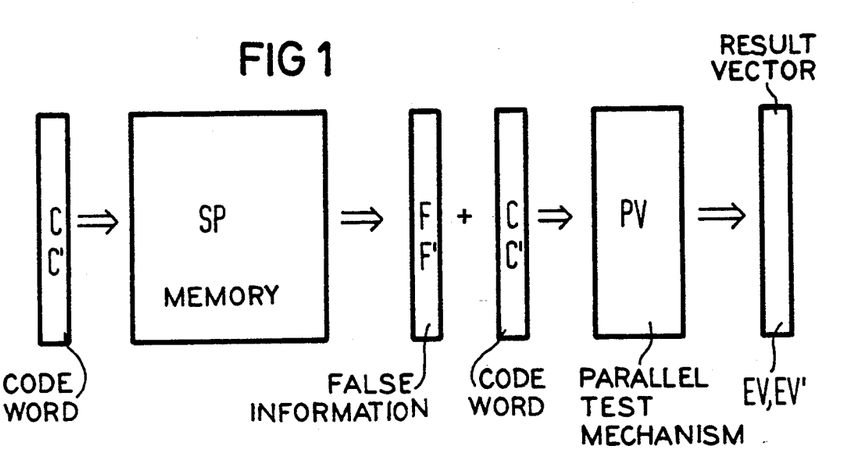
FIG. 1 is a symbolic representation of the principle of the method of the invention for calculating the result vectors.

First and second result vectors are identified in the same manner for the remaining groups of the memory cells of the memory, so that a statement concerning the number of errors and the identification of the memory cell affected with the error within the remaining groups is available.

Since the information concerning the content of all memory cells of a group are available at the same time, the methods using an error-correcting code can be applied in order to recognize and to localize one or more memory cells having faulty properties. What are referred to as code words that can be optimally acquired with the assistance of the Hamming code are used as test patterns. The acquisition of other code words from the theory of error-correcting codes is likewise conceivable; this, however, shall not be discussed in greater detail here.

In order to facilitate an understanding of the method of the present invention, a brief introduction of the theory of error-recognizing codes shall be provided below.

A binary data word C having the length m is called a code word when the modulo 2 multiplication of the data word C by a prescribed, binary test matrix H supplies the zero vector 0 as a result vector. The test matrix H has m columns and is provided with (1d (m+1) rows. What holds true is that the provision of the number of rows (x)=N is the smallest natural number for which N is greater than or equal to x. The matrix must thereby satisfy two conditions. No column should contain only zeros and no column should multiply occur. The coding equation therefore reads:

$$H * C = 0.$$

When the code word is disturbed by an error, then the disturbed code word can be represented by the sum of the undisturbed code word C and of an error vector F.

$$H * (C+F) = H * C + H * F = 0 + H * F = S$$

The multiplication of the disturbed code word by the test matrix leads to the syndrome S that is also referred to as a result vector. The result vector is not dependent on the code word, but is only dependent on the error vector F that has occurred. When the columns of the test matrix H are referenced $h_i$ and when the components of the error vector F are referenced $f_i$, then one can also write:

$$H * F = \sum_{i=m}^{m} h_i * f_i$$

When the code word is disturbed at only one location, for example at the position j, then only the $j^{th}$ component of the error vector is equal to 0. Then valid is:

$f_i = 0$ for i unequal to j
$f_i = 1$ for i equal to j.

Then following therefrom for the syndrome S is:

$$S = H * F = \sum_{i=1}^{m} h_i * f_i = h_j$$

When exactly one error occurs at the position j, then the syndrome is equal to the $j^{th}$ column of the test matrix H. When the test matrix is then constructed such that the column content corresponds to the binarily-represented column position, then the syndrome directly produces the address of the faulty bit.

As already set forth, the first and second result vectors that correspond to the syndromes of the theory of error-recognizing codes are formed from a modulo 2 multiplication between the information read out from the memory cells of the group and a test matrix prescribed by the error-correcting code. The information that are read out again exactly supply the undisturbed code word when all memory cells of the group are free of error and supply a disturbed code word in case at least one faulty memory cell has appeared within the group.

The test matrix H for a 16 bit parallel test that, for example, can be utilized for 16M or 64M memories, contains only ones in the first row. Given exactly two errors, the syndrome is equal to the sum of the two columns of the coding matrix. The first element of the syndrome is then zero and thus indicates the double error. Rows 2–5 indicate the position of the column as a binary number, whereby 2 corresponds to the least-significant row ($2^0$) and row 5 correspond to the most significant bit ($2^3$). Given exactly one error, the elements 2-5 of the syndrome indicate the error position. The test matrix H for a 16-bit parallel test with the assistance of the Hamming code can be simplified as follows:

```
1 1 1 1 1 1 1 1 1 1 1 1 1 1 1 1
0 1 0 1 0 1 0 1 0 1 0 1 0 1 0 1
0 0 1 1 0 0 1 1 0 0 1 1 0 0 1 1
0 0 0 0 1 1 1 1 0 0 0 0 1 1 1 1
0 0 0 0 0 0 0 0 1 1 1 1 1 1 1 1
```

Since a code word is composed of a data vector having freely-selectable data bits and of a calculated redundancy vector, a set of code words must be calculated once before the introduction of the test method. This occurs with the assistance of a modulo 2 matrix multiplication between a redundancy matrix prescribed by the error-correcting code and the data vector. The code word set calculated once can then be employed over and over again. The rule for generating the code words for a 16-bit parallel test is set forth below, whereby the 16-place binary code word is composed of 11 freely-selectable data bits and of 5 calculated redundancy bits.

$$\begin{bmatrix} R0 \\ R1 \\ R2 \\ R4 \\ R8 \end{bmatrix} = \begin{bmatrix} 1 & 1 & 1 & 0 & 1 & 1 & 0 & 1 & 0 & 0 & 1 \\ 1 & 1 & 0 & 1 & 1 & 0 & 1 & 0 & 1 & 0 & 1 \\ 1 & 0 & 1 & 1 & 0 & 1 & 1 & 0 & 0 & 1 & 1 \\ 0 & 1 & 1 & 1 & 0 & 0 & 0 & 1 & 1 & 1 & 1 \\ 0 & 0 & 0 & 0 & 1 & 1 & 1 & 1 & 1 & 1 & 1 \end{bmatrix} * \begin{bmatrix} D3 \\ D5 \\ D6 \\ D7 \\ D9 \\ D10 \\ D11 \\ D12 \\ D13 \\ D14 \\ D15 \end{bmatrix}$$

The positions of the data and redundancy bits are prescribed by the selection of the code. In this case, they read:

$$C = [R0\ R1\ R2\ D3\ R4\ D5\ D6\ D7\ R8\ D9\ D10\ D11\ D12\ D13\ D14\ D15]^T$$

Since 11 data bits are freely selectable, the selection of $2^{11} = 2048$ different test patterns derive for the parallel test. This high flexibility with respect to the test patterns is advantageous, particularly for the test of memory cells in the neighboring environment. Due to the spatial position of the memory cells, a mutual, capacitative influencing thereby arises for which a test pattern having a high "0", "1" sequence should be utilized.

The result vectors in the evaluation derive as a weighted sum over the various columns of the coding matrix H dependent on the nature of the errors that have appeared. Both the result vectors having one error bit for an even or, respectively, odd plurality of errors and bits for individual error address. What holds true for the evaluation of the result vectors is that all memory cells within a group are functionable when the first result and the second result vectors are zero, and that exactly one memory cell of the group can be identified as being non-functional when one of the two result vectors indicates zero and the other of the two result vectors indicates an error. In this case, the address of the non-functioning memory cell within the group is indicated by the bits of the individual error address in the result vector that differs from zero. When exactly two memory cells within a group are non-functional, the same can be recognized in that one of the two result vectors is equal to zero and the other result vector indicates two errors. The error address within the group of the memory cells can thereby no longer be identified. Finally, two or more memory cells are malfunctioning within the group when the first result vector and the second result vector each indicate an error with different individual bit error addresses. For all other bit combinations of the result vectors, more than two memory cells within the appertaining group are non-functional cells. Since the code word was formed with the assistance of the Hamming code, a result vector indicates an uneven plurality of errors precisely when the first bit thereof is unequal to zero. An even-numbered plurality of errors, by contrast, is indicated when the result vector has a zero in the first bit thereof and the remaining bits are thereby not equal to zero.

When an error is detected and localized, then this memory cell must be tested again because an uneven plurality of errors greater than 1 could have lead to the same diagnosis. This stems from the fact that the selection of the error-recognition code, the Hamming code in this case, was designed for the correction of individual bit errors and for the recognition of two bit errors. Irrelevant results are thereby obtained given the appearance of more than two errors within the memory cells of a group. When, in the described method, therefore, uneven pluralities of errors greater than 1 occur, then an individual bit error is erroneously indicated. When an even-numbered plurality of errors greater than 2 occur, then a double error is detected in this case. The appearance of hidden errors is also possible. Given the condition that all possible error combinations occur with the same frequency, freedom from error is indicated in 3% of all possible cases of error, namely when the error vector itself is again a code word. Since, however, both the code word and the inverted code word must be overlaying by an error that itself is a code word in both instances, the probability for the appearance of a hidden error is extremely low. For code words having the length m, the probability for the appearance of such an error amounts to $1:2^{2N}$ (ceil (ld(M+1))=N is thereby valid). Since, further, not all error pluralities occur with the same frequency, but the individual bit errors and the bit line errors are dominant in a stable manufacturing process, the hit percentage of the parallel test method of the invention lies at about 99.9%. In this case, bit line errors act on the parallel test method like individual bit errors.

An example of a 16-bit wide parallel test shall be set forth below, this being capable of being utilized for checking memory cells with a 16M or 64M semiconductor memory. For this 16-bit parallel test, 11 bits in the code word are freely-selectable bits and represent the data vector, whereas the remaining 5 bits that form what are referred to as the redundancy vector must be calculated.

$$D = [D3\ D5\ D6\ D7\ D9\ D10\ D11\ D12\ D13\ D14\ D15]^T$$
$$= [0\ 1\ 0\ 0\ 0\ 0\ 0\ 1\ 0\ 1]^T$$

was selected as an 11-place data vector D.

For calculating the redundancy vector, the 11-place data vector D is now multiplied modulo 2 by the rigidly-prescribed redundancy matrix.

$$\begin{bmatrix} R0 \\ R1 \\ R2 \\ R4 \\ R8 \end{bmatrix} = \begin{bmatrix} 1\ 1\ 1\ 0\ 1\ 1\ 0\ 1\ 0\ 0\ 1 \\ 1\ 1\ 0\ 1\ 1\ 0\ 1\ 0\ 1\ 0\ 1 \\ 1\ 0\ 1\ 1\ 0\ 1\ 1\ 0\ 0\ 1\ 1 \\ 0\ 1\ 1\ 1\ 0\ 0\ 0\ 1\ 1\ 1\ 1 \\ 0\ 0\ 0\ 0\ 1\ 1\ 1\ 1\ 1\ 1\ 1 \end{bmatrix} * \begin{bmatrix} 0 \\ 1 \\ 0 \\ 0 \\ 0 \\ 0 \\ 0 \\ 0 \\ 1 \\ 0 \\ 1 \end{bmatrix} = \begin{bmatrix} 0 \\ 1 \\ 1 \\ 1 \\ 0 \end{bmatrix}$$

The 5-place redundancy vector can therefore be described as $R = [0\ 1\ 1\ 1\ 0]^T$.

For forming the 16-place code word that is written into the memory cells of a selective group, the 11-place data vector and the 5-place redundancy vector are now combined in the following manner:

$$C = [R0\ R1\ R2\ D3\ R4\ D5\ D6\ D7\ R8\ D9\ D10\ D11\ D12\ D13\ D14\ D15]^T$$
$$= [0\ 1\ 1\ 0\ 1\ 1\ 0\ 0\ 0\ 0\ 0\ 0\ 0\ 1\ 0\ 1]^T$$

This exemplary code word is now written into the 16-bit group of the memory to be tested.

Subsequently, the information that are again read from the memory cells of the appertaining group are supplied to the parallel test mechanism, whereby the plurality of errors and, potentially, the error address is identified. When the information read exactly corresponds to the input code word, then no error is present. In this case, the result vector is the zero vector. This can also be shown in that the information read are multiplied modulo 2 by the test matrix H.

$$H*C = \begin{bmatrix} 1\ 1\ 1\ 1\ 1\ 1\ 1\ 1\ 1\ 1\ 1\ 1\ 1\ 1\ 1\ 1 \\ 0\ 1\ 0\ 1\ 0\ 1\ 0\ 1\ 0\ 1\ 0\ 1\ 0\ 1\ 0\ 1 \\ 0\ 0\ 1\ 1\ 0\ 0\ 1\ 1\ 0\ 0\ 1\ 1\ 0\ 0\ 1\ 1 \\ 0\ 0\ 0\ 0\ 1\ 1\ 1\ 1\ 0\ 0\ 0\ 0\ 1\ 1\ 1\ 1 \\ 0\ 0\ 0\ 0\ 0\ 0\ 0\ 0\ 1\ 1\ 1\ 1\ 1\ 1\ 1\ 1 \end{bmatrix} * \begin{bmatrix} 0 \\ 1 \\ 1 \\ 0 \\ 1 \\ 1 \\ 0 \\ 0 \\ 0 \\ 0 \\ 0 \\ 0 \\ 0 \\ 1 \\ 0 \\ 1 \end{bmatrix} = \begin{bmatrix} 0 \\ 0 \\ 0 \\ 0 \\ 0 \end{bmatrix}$$

In the realization to be set forth below, the modulo 2 matrix multiplication is realized by the parallel test mechanism and by a selected, hard wiring between the memory cells and the parallel test mechanism.

When the memory cell in the selected group is malfunctioning, then this is felt therein that the information read do not coincide with the specified code word. In this example, position 10 within the group of memory cells is now assumed to be non-functional. This, however, means that the code word is disturbed precisely at the position 10.

$$F = [F0\ F1\ F2\ F3\ F4\ F5\ F6\ F7\ F8\ F9\ F10\ F11\ F12\ F13\ F14\ F15]^T$$
$$= [0\ 0\ 0\ 0\ 0\ 0\ 0\ 0\ 0\ 0\ 1\ 0\ 0\ 0\ 0\ 0]^T$$

Following therefrom for the information read is that they have a value $$C + F = [0\ 1\ 1\ 0\ 1\ 1\ 0\ 0\ 0\ 0\ 1\ 0\ 0\ 1\ 0\ 1]^T.$$

Given the evaluation within the parallel test mechanism, $E = [1\ 0\ 1\ 0\ 1]^T$ then derives as a syndrome or, respectively, result vector. The result vector is unequal to 0; i.e. an error was recognized. The first bit of the result vector is 1, whereby an individual bit error is present. The bits 2-5 in this case supply the binary number 1 0 1 0, whereby the bit 2 has the lowest significance. The error was therefore recognized at the position 10 of the code word and can be corrected. Mathematically, the evaluation within the parallel test mechanism can again be described as modulo 2 multiplication of the information read by the test matrix:

$$H*(C + F) = \begin{bmatrix} 1\ 1\ 1\ 1\ 1\ 1\ 1\ 1\ 1\ 1\ 1\ 1\ 1\ 1\ 1\ 1 \\ 0\ 1\ 0\ 1\ 0\ 1\ 0\ 1\ 0\ 1\ 0\ 1\ 0\ 1\ 0\ 1 \\ 0\ 0\ 1\ 1\ 0\ 0\ 1\ 1\ 0\ 0\ 1\ 1\ 0\ 0\ 1\ 1 \\ 0\ 0\ 0\ 0\ 1\ 1\ 1\ 1\ 0\ 0\ 0\ 0\ 1\ 1\ 1\ 1 \\ 0\ 0\ 0\ 0\ 0\ 0\ 0\ 0\ 1\ 1\ 1\ 1\ 1\ 1\ 1\ 1 \end{bmatrix} * \begin{bmatrix} 0 \\ 1 \\ 1 \\ 0 \\ 1 \\ 1 \\ 0 \\ 0 \\ 0 \\ 0 \\ 1 \\ 0 \\ 0 \\ 1 \\ 0 \\ 1 \end{bmatrix} = \begin{bmatrix} 1 \\ 0 \\ 1 \\ 0 \\ 1 \end{bmatrix}$$

Figure 2:
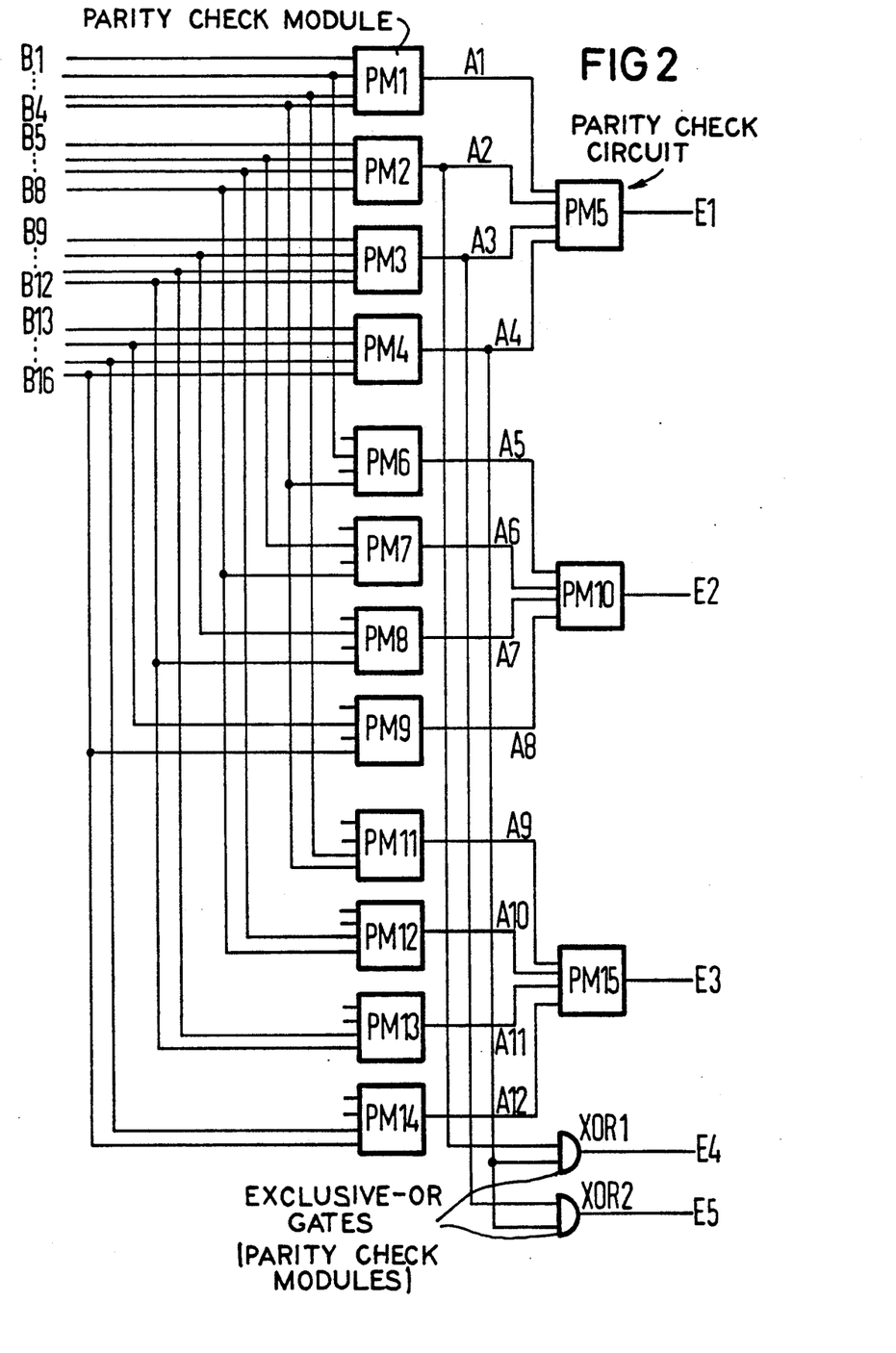
FIG. 2 is a schematic representation of the overall structure of an exemplary parallel test apparatus having a width of 16-bits for calculating the result vectors, whereby the Hamming code may be utilized as an error-correcting code.

FIG. 2 illustrates the overall structure of an exemplary parallel test mechanism having a width of 16 bits for calculating the overall result vector, whereby the Hamming code is utilized as an error-correcting code. The parallel test mechanism is constructed such that a modulo 2 multiplication with the information read from the memory cells and with the test matrix can be carried out therewith. Since the read-out information mathematically corresponds to a vector, the modulo 2 matrix multiplication between the read information and the test matrix is equivalent to a weighted parity check of the read information. It is carried out in that the components of the read information are taken into consideration that correspond with a 1 of the vector in the test matrix. The plurality of rows in the test matrix thereby indicate how often a parity formation is to be carried out, whereby one row of the test matrix is employed as weighting for each parity formation. Each of the five rows of the test matrix therefore corresponds to a parity check circuit. A 1 in the matrix row corresponds to the presence of a data input; a 0 denotes that the appertaining bit of the data vector does not enter into the parity calculation. In the first row, therefore, the parity over the entire information read is formed, whereas only each second bit of the read information is involved in the parity calculation in the second row of the test matrix. The 16 bits of the read information are available at the I/O lines of the semiconductor memory, being available as 4-bit words. It is therefore beneficial to construct the parallel test mechanism in a tree-like cascade of 4-bit parity modules and to spatially separate the modules, the parallel test mechanism being composed of a maximum of five parity test circuits having up to 16 inputs. The sub-results of the fourth and fifth rows of the coding matrix are already available due to the evaluation of the first row. Only three parity check circuits, as well as two additional EXCLUSIVE-OR gates, the XOR gates XOR1 and XOR2 are therefore required for the overall structure. The first parity check circuit comprises a plurality of parity check modules PM1, PM2, PM3, PM4 and PM5 and supplies a first bit E1 of the result vector at its output. The second parity check circuit comprises a plurality of parity check modules PM6, PM7, PM8, PM9 and PM10 and supplies a second bit E2 of the result vector, whereas the third parity check circuit comprises a plurality of parity check modules P11, P12, P13, P14 and P15 and supplies a third bit E3 of the result vector. A fourth bit E4 is provided at the output of an EXCLUSIVE-OR gate XOR1 and a fifth bit E5 of the result vector is provided at the output of an EXCLUSIVE-OR gate XOR2. Each parity check circuit is constructed in a tree-like cascade structure, so that the output A1 of the parity check module PM1, the output A2 of the parity check module PM2, the output A3 of the parity check module PM3 and the output A4 of the parity check module PM4 are each connected to a respective input of the parity check module PM5. The output A5 of the parity check module PM6, the output A6 of the parity check module PM7, the output A7 of the parity check module PM8 and the output A8 of the parity check module PM9 are connected to respective inputs of the parity check module PM10. The output A9 of the parity check module PM11, the output A10 of the parity check module PM12, the output A11 of the parity check module PM13, and the output A12 of the parity check module PM14 are each connected to a respective input of the parity check module PM15. Further, the output A2 and the output A4 are each connected to a respective input of the EXCLUSIVE-OR gate XOR1 and the output A3 and, again, the output A4 are each connected to a respective input of the EXCLUSIVE-OR gate XOR2. It must thereby be taken into consideration that an EXCLUSIVE-OR gate is available as the most simple circuit structure as a parity check circuit for two inputs. A dexterous structuring of the parity check module PM5 makes it possible to co-implement the logical function of the EXCLUSIVE-OR gate XOR2, so that the same not be additionally constructed. Since, as already mentioned, the first row of the test matrix is occupied with one value, the parity is formed over the entire information to be read. To this end, the bits B1, B2, B3 and B4 of the information to be read are connected to respective inputs of the parity check module PM1. The bits B5, B6, B7 and B8 of the information to be read are connected to respective inputs of the parity check module PM2. The bits B9, B10, B11 and B12 of the information to be read are connected to respective inputs of the parity check module PM3. The bits B13, B14, B15 and B16 are connected to respective inputs of the parity check module PM4. The second row of the test matrix comprises a 0, 1 combination in alternation, so that the first and third inputs of the parity check module PM6 do not enter into the parity calculation. The second input is connected to receive the bit B2 and the fourth input is connected to receive the bit B4 of the information to be read. In an analogous manner, the first and third inputs of the parity check module PM7 are not connected to receive information bits. The second input is connected to receive the bit B6 and the fourth input is connected to receive the bit B8. The parity check module PM8 and the the parity check module PM9 likewise do not have their first and third inputs connected to receive information bits. The parity check module PM8 has its second input connected to receive the bit B10 and its fourth input connected to receive the bit B12. Finally, the parity check module PM9 has its second input connected to receive the bit B14 and its fourth input connected to receive the bit B16, the first and third inputs not being connected to receive the information bits. The third row of the test matrix has a 0011 sequence, so that respectively the first and second inputs of the parity check modules PM11, PM12, PM13 and PM14 are not to be connected to receive information bits. The third input of the parity check module PM11 is connected to receive the bit B3 and the fourth input of the parity check module PM11 is connected to receive the bit B4. The third and fourth inputs of the parity check module PM12 are to be connected to receive the bit B7 and the bit B8, respectively, and the third and fourth inputs of the parity check module PM13 are connected to receive the bits B11 and B12, respectively. The third input of the parity check module PM14 is connected to receive the bit B15 and the fourth input thereof is connected to receive the bit B16 of the information to be read.

When a different test matrix H is selected, then the inputs lying between the bits of the read-out information B1-B16 and the parity check modules PM1-PM14 is to be undertaken in accordance with this test matrix and the EXCLUSIVE-OR gates XOR1, XOR2 may be potentially augmented by two further parity check circuits.

Figure 3:
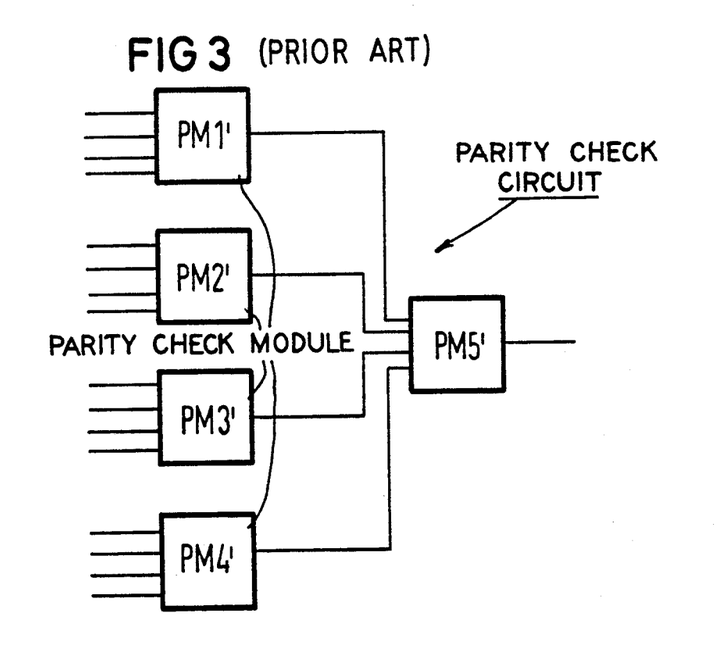
FIG. 3 is a schematic representation of the structure of an exemplary 16-bit parity check circuit for identifying a bit of a result vector.

FIG. 3 again shows the structure of an exemplary 16-bit parity check circuit for calculating one bit of a result vector. In this case, the structure is again constructed in a tree-like manner of a plurality of parity check modules PM1', PM2', PM3', PM4' and PM5'. In detail, the output of the parity check module PM1', the output of the parity check module PM2', the output of the parity check module PM3' and the output of the parity check module PM4' are each connected to a respective input of the parity check module PM5'. The output thereof thereby supplies a bit of a result vector, whereas the read-out information are respectively applied to the inputs of the parity check modules PM1'-PM4' as a 4-bit word.

Figure 4:
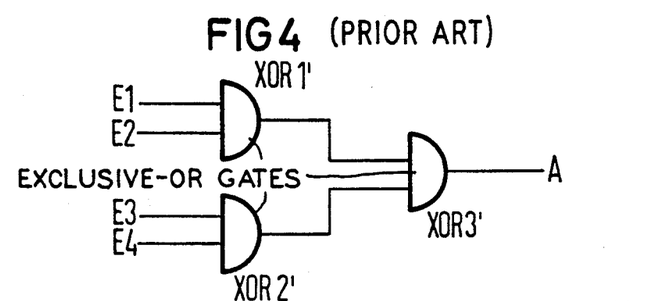
FIG. 4 is a schematic logic diagram of a first structure for realizing a parity test module for a parity check circuit.

FIG. 4 illustrates a first possibility for realizing a parity check module that is constructed of three EXCLUSIVE-OR gates XOR1', XOR2' and XOR3'. The output of the EXCLUSIVE-OR gate XOR1' and the output of the EXCLUSIVE-OR gate XOR2' are each connected to a respective input of the EXCLUSIVE-OR gate XOR3'. The inputs E1, E2 of the EXCLUSIVE-OR gate XOR1' form the first and second inputs of the parity check module and the inputs E3, E4 of the EXCLUSIVE-OR gate XOR2' form the third and fourth inputs of the parity check module. The output A of the EXCLUSIVE-OR gate XOR3' forms the output of the parity check module. When the entire parity check circuit is then constructed of EXCLUSIVE-OR gates, then the layout of such a circuit has a non-uniform area utilization as a result of the tree-like cascade structure. The realization of a parity check module having a uniform area exploitation, however, is enabled with the circuit illustrated in FIG. 5.

Figure 5:
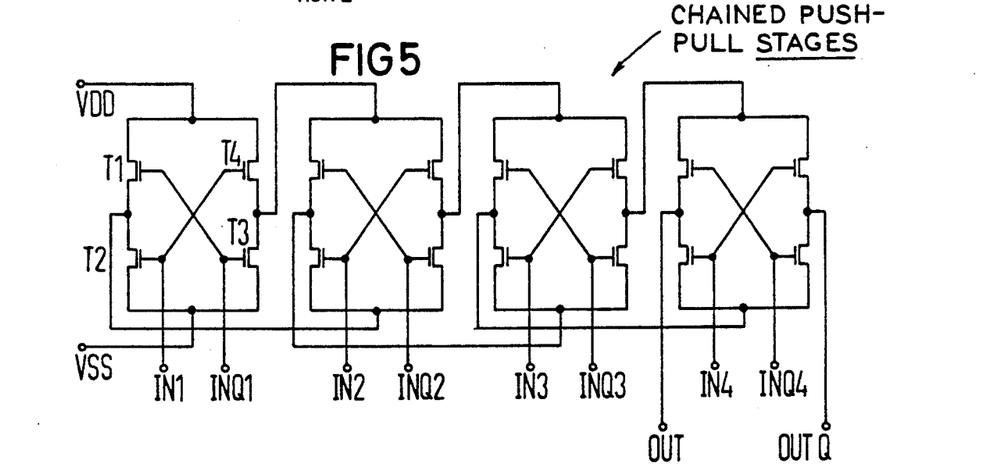
FIG. 5 is a schematic circuit diagram of a second circuit structure for realizing a parity test module for a parity check circuit.

FIG. 5 shows a second embodiment of realization of a parity check module that is composed of a series circuit of push-pull stages. Four chained push-pull stages are required for a parity check module, whereby respectively two chained push-pull stages form an EXCLUSIVE-OR function. On the basis of a series circuit of all four stages, however, a logical function that corresponds to the circuit of FIG. 4 can be constructed. Each push-pull stage contains a first voltage input and a second voltage input, a first voltage output and a second voltage output, a first data input and a second data input that are respectively occupied with complementary input signals. The first voltage input of the first push-pull stage is connected to a first voltage $V_{DD}$. The second voltage input of the first push-pull stage is connected to a second voltage, in this case ground $V_{SS}$. The first and second voltage outputs of the fourth push-pull stage form a first and second, respective, complementary output OUT, OUTQ of the parity check module. The remaining push-pull stages are then chained such that a respective first and second voltage output of the one push-pull stage is connected to a respective first and second voltage input of the other push-pull stage.

As an example for the structure of all push-pull stages. The first stage is constructed of four field-effect transistors having the same conductivity type, whereby a first field-effect transistor and a second field-effect transistor T1, T2 form a first series circuit and a third field-effect transistor T3 and a fourth field-effect transistor T4 form a second series circuit. Both series circuits are connected in parallel, whereby one terminal of the first field-effect transistor T1 and one terminal of the fourth field-effect transistor T4 form a first, common terminal and one terminal of the second field-effect transistor T2 and one terminal of the third field-effect transistor T3 form a second, common terminal. The first common terminal thereby forms the first voltage input and is connected at the first stage with the voltage $U_{DD}$. The second common terminal forms the second voltage input and is connected to the second voltage, in this case ground $V_{SS}$. The center terminal of the first series circuit thereby forms a first voltage output that is to be connected to the voltage input of the next push-pull stage. The center terminal of the second series circuit forms the second voltage output of the first push-pull stage and is connected to the second voltage input of the next push-pull stage. The gate terminal of the second field-effect transistor T2 and the gate terminal of the fourth field-effect transistor T4 in common form the first data terminal IN1 and the gate terminal of the first field effect transistor T1 and the gate terminal of the third field-effect transistor T3 in common form the complementary, second data input INQ1. The remaining push-pull stages are likewise respectively constructed of four field-effect transistors of the same conductivity type, whereby the inputs IN2, INQ2, IN3, INQ3 and IN4, INQ4 here also respectively represent complementary data inputs.

For the operation of the chained push-pull stages, the operation of the first stage is set forth hereinbelow to represent that of all stages. A high signal applied to the first data input IN1 and a low signal applied to the first, inverted data input INQ1 are assumed. Given application of these input signals, the field-effect transistors T2 and T4 are conductive and the field-effect transistors T1 and T3 inhibit. Consequently, the first voltage output that is located at the center terminal between the two field-effect transistors T1 and T2 is connected with a voltage $V_{SS}$ equal to ground. By contrast, the second voltage output at the center tap between the two field effect transistors T3 and T4 is occupied with the operating voltage $V_{DD}$. When the first data input IN1 is connected to a low signal and the complementary, second data input INQ1 is connected to a high signal, the signal having the voltage $U_{DD}$ is applied at the first voltage output and a signal having the voltage $V_{SS}$ is applied at the second voltage output. What is achieved by chaining the push-pull stages is that, given application of an even-numbered plurality of high or, respectively, low signals at the inputs IN1, IN2, IN3 or IN4 or, respectively, the data inputs complementary therewith, the voltage $V_{SS}$ arises at the output OUT of the parity check module and the voltage $V_{DD}$ arises at the output OUTQ thereof. When, by contrast, an odd-numbered plurality of high and, therefore, of low signals is applied to these inputs or, respectively, to the complementary data inputs, then a voltage signal that corresponds to the voltage $V_{DD}$ appears at the output OUT. A voltage signal having the value $V_{SS}$ appears at the output OUTQ. The logical output behavior of these four chained push-pull stages therefore exactly corresponds to that of the three wired EXCLUSIVE-OR gates of FIG. 4.

As already set forth, two chained push-pull stages form an EXCLUSIVE-OR gate and four chained push-pull stages form a parity check module. It should also be pointed out that it is possible to serially construct a parity check circuit with the assistance of chained push-pull stages for calculating a bit of a result vector. A total of sixteen push-pull stages chained to one another are required for this purpose, whereby the individual stages are interconnected to one another in the manner illustrated in FIG. 5.

Figure 6:
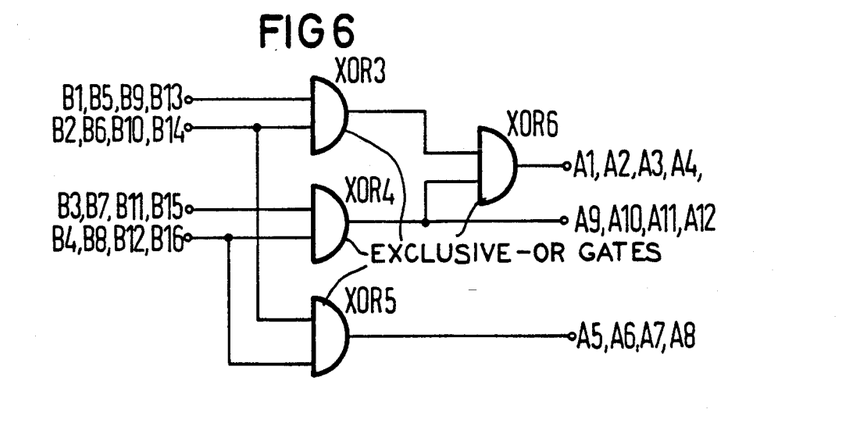
FIG. 6 is a schematic logic diagram of a minimized parallel test apparatus having a width of 16 bits.

Since each row of the test matrix corresponds to a parity check circuit, the parallel test mechanism can have its circuit expense optimized by minimization steps. When the test matrix is divided into four's sections, then four sections each having four columns that can be sub-divided into five rows are formed. One can thereby see that rows 1-3 of these four's sections of the test matrix are identical, this meaning that the parity check circuits in all sections can be identical. This particularly benefits a modular structure. FIG. 6 then illustrates a sub-circuit of the minimized parallel test mechanism having a width of 16 bits. The parity check modules PM1–PM4, PM6–PM9 and PM11–PM14 of FIG. 2 are thereby replaced by four such circuits of FIG. 6. The first sub-circuit is to be connected to receive the bits B1, B2, B3 and B4 of the information read from the memory cells. The second sub-circuit is to be connected to receive the bits B5, B6, B7 and B8. The third sub-circuit is to be connected to receive the bits B9, B10, B11 and B12. The fourth sub-circuit is to be connected to receive the bits B13, B14, B15 and B16. The outputs corresponding to the outputs A1, A5 and A9 in FIG. 2 now lie at the outputs of the first sub-circuit. The output signals of the outputs A2, A6 and A10 are available at the output of the second sub-circuit. The third sub-circuit supplies the outputs A3, A7 and A11 and the fourth sub-circuit supplies the outputs A4, A8 and A12. The interconnection of these outputs to the parity check modules PM5, PM10, PM15, as well as to the additional two EXCLUSIVE-OR gates XOR1 and XOR2 of FIG. 2 is to be undertaken as therein in order to construct a complete parallel test mechanism. A single sub-circuit is then constructed with the assistance of four EXCLUSIVE-OR gates XOR3, XOR4, XOR5 and XOR6. The first three EXCLUSIVE-OR gates XOR3, XOR4 and XOR5 thereby lie in the input domain, whereas the fourth EXCLUSIVE-OR gate XOR6 follows the two EXCLUSIVE-OR gates XOR3 and XOR4. The first two inputs that are connected to receive the bits B1 and B2 or, respectively, B5, B6, etc., are connected to the EXCLUSIVE-OR gate XOR3. The bits B3, B4 or, respectively, B7, B8, etc. are connected to inputs of the EXCLUSIVE-OR gate XOR4. The third EXCLUSIVE-OR gate XOR5, finally, is connected with the respective assistance of the second terminal of the two EXCLUSIVE OR gates such that the inputs B2, B4 or, respectively B6, B8, etc., are applied thereto. The output of the EXCLUSIVE-OR gate XOR3 and the output of the EXCLUSIVE-OR gate XOR4 are connected to respective inputs or the EXCLUSIVE-OR gate XOR6 whose output supplied the output A1 in the first sub-circuit or, respectively, A2 in the second sub-circuit, etc. The output of the EXCLUSIVE-OR gate XOR4 in the first sub-circuit forms the output A9 or, respectively, in the second sub-circuit forms the output A10, etc. The output EXCLUSIVE-OR gate XOR5 provides the output A5 in the first sub-circuit or the output A6 in the second sub-circuit and, correspondingly, represents the outputs A7 and A8 in the third and fourth sub-circuits. The sub-circuit shown in FIG. 6 then makes it possible to construct the input domain with 4×4, i.e. a total of 16 gates, this particularly representing an increased saving of space in constructing the parallel test mechanism.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for parallel testing of memory cells of a memory, in which the memory is divided into groups of memory cells, comprising the steps of:
   (a) producing and writing a test pattern of freely-selectable data bits into the memory cells of a group of memory cells;
   (b) reading the memory cells of the group in parallel and forming a first test result vector;
   (c)) producing and writing a further test pattern which consist of the one's complement of the test pattern into the memory cells of the same group;
   (d) reading the memory cells of the same group in parallel and forming a second test result vector; and
   (e) using the first and second test result vectors to determine the number of errors for determining the number of memory cells of a group affected with error.

2. The method of claim 1, wherein the steps of forming the first and second test result vectors are each further defined as:
   performing a matrix multiplication to obtain a modulo-2 matrix multiplication of the information read from the memory cells of the group with a predetermined test matrix prescribed by an error-correcting code.

3. The method of claim 1, further comprising the steps of:
   (f) performing the steps (a) through (e) for all of the other groups of memory cells of the memory to obtain respective first and second test result vectors for each group; and
   (g) identifying the memory cells of the other groups affected with errors.

4. The method of claim 3, and further defined as:
   forming a code word for writing into the memory cells from a data vector of freely-selectable data bits and a redundancy vector of prescribed redundancy bits calculated from a modulo-2 multiplication between a redundancy matrix prescribed error-correcting code and the data vector;
   forming the first and second test result vectors from an error bit for an even-numbered and an odd-numbered plurality of errors and bits for individual error address; and
   calculating the number of errors from the first and second test result vectors and for the identification of the memory cells within a group affected with an error such that all memory cells within the group are functional when the first test result vector and the second test result vector are zero, a memory cell in the group is non-functional when one of the two test result vectors is zero and the other test result vector indicates an error, the address of a non-functional memory cell is indicated by the bits of the individual error address in the other of the two test result vectors, exactly two memory cells are non-functional within the group when one test result vector is zero and the other test result vector indicates two errors, two or more memory cells within the group are non-functional when the first and second test result vectors indicate an error, and more than two memory cells within the group are non-functional for all other bit combinations of the test result vectors.

5. The method of claim 4, and further defined as:
   forming the code word with a Hamming code such that one of the two test result vectors indicates an odd-numbered plurality of errors when a first bit thereof is equal to zero, and that one of the two result vectors indicates an even-numbered plurality of errors when a first bit thereof is equal to zero and the remaining bits thereof are not equal to zero.

6. The method of claim 5, and further defined as:

dividing the memory into groups of memory cells of 4×4 bit words;

reading and supplying the read information from a group of 4×4 bit words; and forming the code word with an 11-bit data vector and a 5-bit redundancy vector.

7. Apparatus for parallel testing of memory cells of a memory in which the memory cells are divided into groups of memory cells, comprising:

writing and reading means connected to said memory for writing in and reading out in parallel into and out of said memory cells of a selected group of memory cells a test pattern of freely-selectable data bits, and then writing in and reading out of the memory cells of the same selected group a further test pattern in parallel; and a parallel test device including a plurality of parity test circuits defined by the number of rows of a test matrix, said test matrix including a plurality of rows in which each row of a test matrix is assigned to a parity test circuit whereby the formation of a modulo 2 matrix multiplication between the information read from the memory cells of the group and the test matrix is realized such that a respective input of the parity test circuit is assigned to a row of the test matrix and is assigned to a respective output of the memory cells of a group and are connected to one another when an appertaining column of the row of the test matrix comprises a "1" and are not connected to one another when the appertaining column of the row of the test matrix comprises a "0", and whereby a bit of the result vector can be taken at the output of each parity test circuit and, said parallel test device thereby operable to produce a respective test result vector for identifying errors.

8. The apparatus of claim 7, wherein:
each of said parity check circuits comprises a tree-like connection of a plurality of parity check modules.

9. The apparatus of claim 8, wherein:
said parallel test device comprises an information width of 16 bits (B1, B16) for the information read from said memory cells of a selected group;
said parallel test device comprises first, second and third parity check circuits, said first parity check circuit comprising five parity check modules, a first of said parity check modules including four inputs for the first four bits (B1, B4) of the read information, and an output, a second of said parity check modules including four inputs for the second four bits (B5, B8) of the read information, and an output, a third of said parity check modules including four inputs for the third four bits (B9, B12) of the 16 bits of read information, and an output, a fourth of said parity check modules including four inputs for receiving the fourth four bits (B13, B16) of the 16 bits of read information, and an output, and a fifth of said parity check modules including four inputs connected to respective outputs of said first, second, third and fourth parity check modules, and a respective test result vector output.

10. The apparatus of claim 9, wherein in said second parity check circuit:
said four inputs of each of said parity check modules comprise first, second, third and fourth inputs;
said first and third inputs of said first, second, third and fourth parity check modules connected to a fixed voltage;

said second input of said first parity check module connected to receive the second bit (B2) and said fourth input of said first parity check module connected to receive the fourth bit (B4);

said second input of said parity check module connected to receive the sixth bit (B6) and said fourth input of said second parity check module connected to receive the eighth bit (B8);

said second input of said third parity check module connected to receive the tenth bit (B10) and said fourth input of said third parity check module connected to receive the twelfth bit (B12);

said second input of said fourth parity check module connected to receive the fourteenth bit (B14) and said fourth input of said fourth parity check module connected to receive the sixteenth bit (B16); and wherein in said parity check circuit
said four inputs of said parity check modules comprise first, second, third and fourth inputs;

said first and second inputs of said first, second, third, and fourth parity check modules are connected to a fixed voltage value;

said third inputs of said first, second, third and fourth parity check modules are connected to receive the respective third, seventh, eleventh and fifteenth bits (B3, B7, B11, B15);

said fourth inputs of said first, second, third and fourth parity check modules are connected to receive the respective fourth, eighth, twelfth and sixteenth bits (B4, B8, B12, B16);

first and second EXCLUSIVE-OR gates each include a first input, a second input and an output;

said first inputs of said first and second EXCLUSIVE-OR gates are connected to said output of said fourth parity check module of said first parity check circuit;

said second inputs of said first and second EXCLUSIVE-OR gates are connected to said outputs of said second and third parity check modules, respectively, of said first parity check circuit; and said outputs providing fourth and fifth bits of said test result vectors.

11. A method for internal parallel testing of memory cells of a memory, in which the memory is divided into groups of memory cells, comprising the steps of:

a) forming a first test vector of a data vector of freely-selected data bits and a redundancy vector calculated from a modulo-2 multiplication between a redundancy matrix prescribed by a hamming code and the data vector;

b) writing the first test vector into the memory cells of a group of memory cells;

c) reading the memory cells of the group and forming a first read out vector;

d) generating a second test vector which consists of the one's complement of the first test vector;

e) writing the second test vector onto the memory cells of the group of memory cells;

f) reading the memory cells of the group and forming a second read out vector;

g) forming a first test result vector by a modulo-2 multiplication between a test matrix prescribed by a hamming code and the first read out vector;

h) forming a second result vector by a modulo-2 multiplication between the test matrix prescribed by a hamming code and the second read out vector;

i) calculating the number of non-functional memory cells within the group from the first and second test result vectors such that all memory cells within the group are functional when the first and second test result vector both are zero, exactly one memory cell in the group is non-functional when one of both test result vectors is zero and the other of both test result vectors indicates an error, exactly two memory cells are non-functional within the group when one test result vector is zero and the other of both test result vectors indicates two errors, two or more memory cells within the group are non-functional when both test result vectors indicate an error, and more than two memory cells within the group are non-functional for all other bit combinations of the test result vectors; and j) locating a non-functional memory cell in the group, in the case of exactly one non-functional memory cell in the group, using the test result vector which indicates an non-functional memory cell to address the non-functional memory cell.

12. Apparatus for internal parallel testing of memory cells of a memory in which the memory cells are divided into groups of memory cells, comprising:

a parallel test device including a plurality of parity test circuits defined by the number of rows of a test matrix prescribed by a hamming code, in which each row of the test matrix is assigned to one parity test circuit and which each column of the test matrix is assigned to an output of a memory cell of a group of memory cells;

a wiring connecting respective outputs of memory cells of a group of memory cells to the parity test circuits such that an respective output of a memory cell is connected to an respective input of a parity test circuit when an appertaining column of the row of the test matrix comprises a 11111 and are not connected to one another when the appertaining column of the row of the test matrix comprises a 11011; and parity circuits comprising a tree-like connection of a plurality of EXOR-Gates to produce at the output of each parity test circuit a respective test result vector for identifying errors.

* * * * *